United States Patent
Reid et al.

(10) Patent No.: US 6,345,135 B1
(45) Date of Patent: Feb. 5, 2002

(54) MULTI-WAVELENGTH OPTICAL REFLECTOR

(76) Inventors: Douglas Charles John Reid, 2A Barby Lane, Hillmorton, Rugby, Warwickshire CV22 8QJ; David James Robbins, 4 Wappenham Road, Abthorpe, Towcester, Northamptonshire, NN12 8QU, both of (GB); Gert Jaak Anna Sarlet, Zwarte Leetouwersstraat 28/2, B-8000 Brugge (BE)

( * ) Notice: Subject to any disclaimer, the term of this patent is extended or adjusted under 35 U.S.C. 154(b) by 0 days.

(21) Appl. No.: 09/306,449

(22) Filed: May 6, 1999

(30) Foreign Application Priority Data

May 6, 1998 (GB) .............................................. 9809583

(51) Int. Cl.[7] ................................................ G02B 6/34
(52) U.S. Cl. ............................ 385/37; 372/99; 372/102
(58) Field of Search ............................ 385/27–30, 37; 359/563, 564, 565, 568–573; 372/102, 98, 99

(56) References Cited

U.S. PATENT DOCUMENTS

| | | | |
|---|---|---|---|
| 4,896,325 A | 1/1990 | Coldren | 372/20 |
| 5,325,392 A | 6/1994 | Tohmori et al. | 372/96 |
| 5,392,311 A * | 2/1995 | Makuta | 372/96 |
| 5,400,422 A | 3/1995 | Askins et al. | 385/37 |
| 5,715,271 A * | 2/1998 | Huang et al. | 372/102 |
| 5,887,094 A * | 3/1999 | Bakhti et al. | 385/28 |
| 6,101,302 A * | 8/2000 | Park et al. | 385/37 |

FOREIGN PATENT DOCUMENTS

| EP | 0 721 121 | 7/1996 | |
|---|---|---|---|
| GB | 2337135 A * | 11/1999 | G02B/6/16 |

OTHER PUBLICATIONS

J. Canning et al., "π–phase–shifted periodic distributed structures in optical fibers by UV post–processing", Electronics Letters, vol. 30(16), pp 1344–1345, Aug. 4, 1994.

* cited by examiner

*Primary Examiner*—Hemang Sanghavi
*Assistant Examiner*—Omar Rojas, Jr.
(74) *Attorney, Agent, or Firm*—Venable; Robert Kinberg; Jeffri Kaminski (57) ABSTRACT

A multi-wavelength optical reflector comprises a diffraction grating structure (18) which comprises a plurality of repeat grating units (20) in which each grating unit (20) comprises a series of adjacent diffraction gratings (22, 24, 26) having the same pitch. The grating units (20) and adjacent gratings within a grating unit are separated by a phase change (28) of substantially pi (π radians). The lengths of the gratings (22, 24, 26), which are different for each grating within a grating unit, are selected so as to provide a predetermined comb reflection spectrum which comprises a plurality of reflection maxima of substantially equal reflectivity.

10 Claims, 7 Drawing Sheets

MULTI-WAVELENGTH OPTICAL REFLECTOR

BACKGROUND OF THE INVENTION

1. Field of the Invention

This invention relates to a multi-wavelength optical reflector which includes a diffraction grating structure and a method of making such a reflector. More especially, although not exclusively, the invention relates to an optical reflector suitable for use with, or as part of, a wavelength division multiplexed (WDM) optical communications system.

2. Description of the Related Art

Narrowband optical reflectors/filters are important for a number of applications in optical telecommunications and signal processing including multiple channel optical telecommunications networks using wavelength division multiplexing (WDM). Such networks can provide advanced features, such as wavelength routing, wavelength switching and wavelength conversion, adding and dropping of channels and wavelength manipulation in much the same way as time slot manipulation in time division multiplexed systems.

WDM is rapidly emerging as a key technology for optical networking, but implementing it requires the development and optimization of many of the optical devices required within such systems. For example, tuneable optical sources are required which can provide the many different wavelengths required for the many different channels. In addition, filters such as comb filters and passband filters are required to exclude spurious signals and wavelength monitoring is required to avoid straying off channel and contaminating the network. Generally such networks must include optical amplifiers, such as the erbium doped fibre amplifier, which currently limits the overall bandwidth to approximately 35 nm. As a consequence, much work is tending to concentrate on developing optical components which operate within the erbium bandwidth window.

A laser suitable for an optical telecommunications network is a Distributed Feedback (DFB) laser diode. Its spectral properties depend principally on the presence of a diffraction grating structure which can be in the form of a surface-relief structure or buried within the device. The grating can be formed as a corrugation which acts as a periodically varying optical waveguide boundary and allows coupling between the forward and backward propagating waves. A DFB laser diode incorporating such a grating structure operates in a first-older spatial harmonic mode whether directly in the first-order or indirectly at the first-order spatial harmonic component of a multiple order grating.

It is common for DFB lasers to include end reflectors, such that the longitudinal mode spectrum is asymmetrically distributed about the Bragg wavelength. This type of DFB laser has one dominant mode and therefore has a stable output at a given wavelength.

U.S. Pat. No. 4,896,325 proposes a wavelength tuneable laser having sampled gratings at the front and rear of its gain region. The gratings produce slightly different reflection combs which provide feedback into the device. The gratings can be current tuned in wavelength with respect to each other. Coincidence of a maximum from each of the front and rear gratings is referred to as supermode. To switch the device between supermodes requires a small electrical current into one of the gratings to cause a different pair of maxima to coincide in the manner of a vernier. By applying different electrical currents to the two gratings, continuous tuning within a supermode can be achieved. For optimum operation of such a laser, the diffraction gratings should ideally have a flat reflection spectrum, that is, it should comprise a plurality of reflection maxima of equal intensity. In practice however, the reflection spectra of the known sampled grating structures have a Gaussian type envelope which limits the total optical bandwidth over which the laser can reliably operate as a single mode device. Additionally, as a consequence of the non-uniform reflection spectra of the gratings, the output power of the laser as a function of wavelength is not uniform. Therefore a need exists for a grating structure having an improved reflection spectrum.

U.S. Pat. No. 5,325,392 discloses a distributed reflector structure which comprises a diffraction grating having a repeating unit of constant length which defines a modulation period and at least one of a number of parameters that determine an optical reflectivity of the grating and varies in dependence on its position in each of the repeating units. In one embodiment, the parameters comprises changing (shortening or lengthening) the pitch of the grating within a single grating period at the selected positions in a repeating unit. These changes in pitch are equivalent to a progressive change in the phase and the resulting structure is thus a chirped grating structure. Since the device requires a number of gradual and progressive changes in pitch, the only techniques available to make the device are electron beam techniques which are expensive and do not lead themselves to large scale production.

The present invention has arisen in an endeavour to provide a multi-wavelength comb reflector filter for use in a WDM system which in part at least overcomes the limitations of the known reflectors.

SUMMARY OF THE INVENTION

According to the present invention, a multi-wavelength optical reflector comprises: a diffraction grating structure comprising a plurality of repeat grating units in which each grating unit comprises a series of adjacent diffraction gratings having the same pitch, wherein grating units and adjacent gratings within a grating unit are separated by a phase change of substantially pi ($\pi$) radians and wherein at least two of the gratings within a grating unit have different lengths, the lengths being selected so as to provide a predetermined reflection spectrum. Since the phase changes within a grating unit are substantially pi radians, this enables the device to be readily manufactured using holographic and photolithographic techniques.

A predetermined reflection spectrum is one in which the reflectivity of individual reflection maxima are chosen to provide an optimum response from the device for its particular application. Typically a predetermined reflection spectrum has a number of individual reflection maxima which have substantially equal reflectivities.

Advantageously adjacent grating units and/or adjacent gratings within a grating unit are substantially contiguous. Although in practice, small gaps between adjacent grating units and/or adjacent gratings may be present when using phase mask holographic techniques to define the phase shifts, such gaps are not found to affect the reflection spectrum appreciably.

Conveniently the lengths of the gratings are selected by superposing a plurality of periodic variations having different periods to form a periodic waveform having a multi-lobed envelope and the relative lengths of the gratings are selected to correspond with the relative lengths at which the envelope tends to zero.

With such a selection method, phase shifts are preferably imparted to individual ones of the plurality of periodic variations. Preferably pairs of the phase shifts are imparted to individual ones of the plurality of variations, the pairs of phase shifts having equal magnitude but opposite signs. A grating structure constructed having grating lengths selected in his manner is found to have more uniform reflection spectrum.

Advantageously the periodic variations are not all in phase at any point along the length over which they are superposed. It will be appreciated that the described selection method can alternatively be used to determined an initial position for the phase shifts and the phase shifts optimised using an iterative process to obtain the desired reflection spectrum.

In a preferred implementation the reflector comprises a waveguide device, though it can alternatively be fabricated as a transmission grating or could, for example, be incorporated as part of a Fabry Perot cavity. The reflector of the present invention can be incorporated into a filter or a laser or can be incorporated as part of a wavelength division multiplexer or demultiplexer.

According to yet a further aspect of the invention, there is provided a method of making a multi-wavelength optical reflector as described above, characterized in that a single exposure step is required to produce a pattern from which the diffraction grating structure can be obtained. In using a single exposure step, the problems encountered with transferring between sequential exposure steps are avoided.

BRIEF DESCRIPTION OF THE DRAWINGS

A multi-wavelength optical reflector in accordance with the invention and a method of making a laser incorporating two reflectors in accordance with the invention will now be described by way of example only with reference to the accompanying drawings in which.

DETAILED DESCRIPTION OF THE PREFERRED EMBODIMENTS

Figure 1:
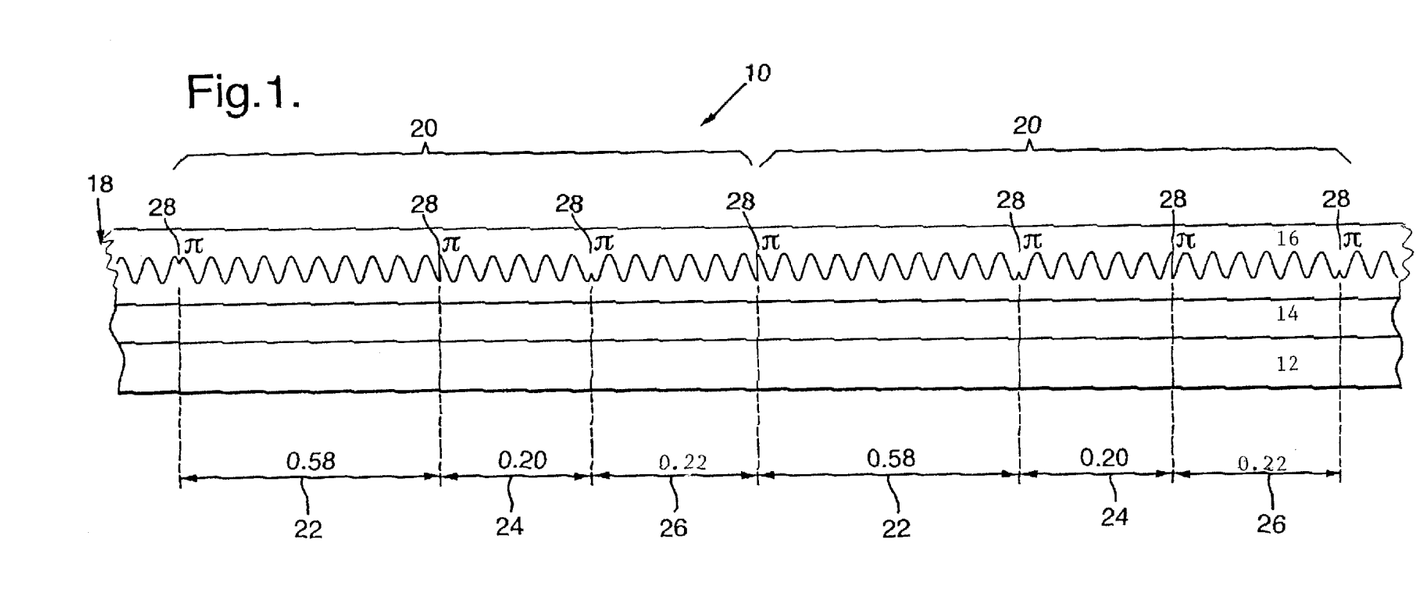
FIG. 1 is a schematic representation of part of a multi-wavelength optical waveguide reflector in accordance with the invention.

Referring to FIG. 1, there is shown a multi-wavelength waveguide reflector 10 in accordance with the invention for operation at a Bragg wavelength of approximately 1.55 μm within the erbium window. The reflector comprises a substrate 12 of Indium Phosphide (InP); an optical guiding layer 14 of Indium Gallium Arsenide Phosphide (InGaAsP) and an upper layer 16 of Indium Phosphide. Since the substrate 12 and upper layer 16 are of a lower refractive index (3.17) to that of the optical layer 14 (3.23), this ensures that light is confined to the guiding layer 14. A grating structure 18 is formed in the outermost surface of the upper layer 16, that is, the surface distal from the junction between the layers 14 and 16 by, for example, dry etching using a photoresist grating as a mask. As is known, a grating structure in close proximity to a waveguide will cause distributed reflections of light propagating through the optical layer 14 such that light is reflected at set wavelengths in dependence upon the grating structure 18.

Unlike the known reflective waveguides, the grating structure 18 of the present invention comprises a number of repeat units 20 each of which comprises three Bragg gratings of identical constant pitch which are of different lengths 22, 24, 26, respectively. Adjacent repeat units 10 and adjacent gratings within a unit 20 are defined by phase shifts of π radians (that is 180 degrees) in the periodic amplitude variation of the grating structure 18. These phase shifts are denoted by the boundaries 28 in FIG. 1.

In an individual repeat unit 20 of nominal length unity, the lengths of the gratings 22, 24, 26 are 0.58, 0.20 and 0.22 respectively. It will be appreciated that in the context of the present invention the lengths are different in a direction of propagation of light through the optical layer 14. For clarity, in the schematic representation of FIG. 1, only two repeat units 20 are illustrated though in practice typically five or more repeat units 20 are present.

Figure 2:
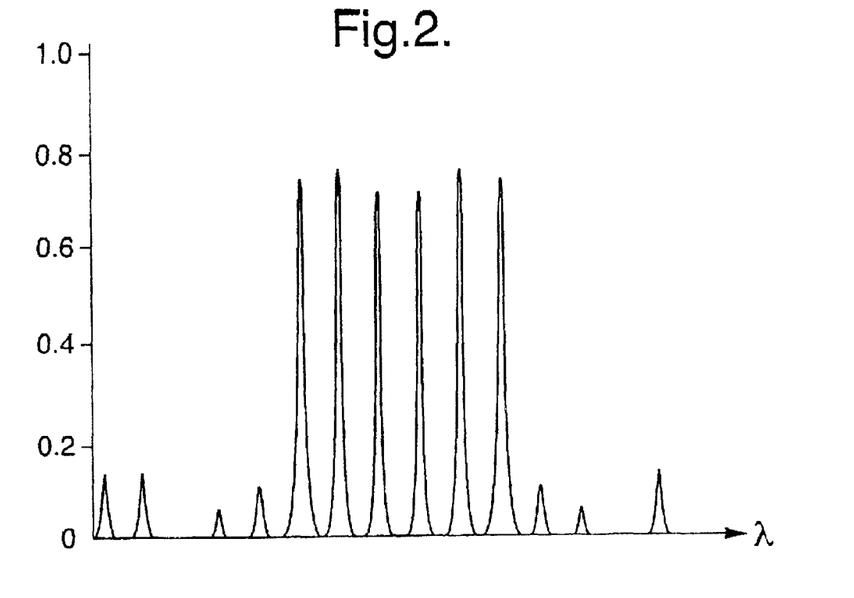
FIG. 2 is the reflection spectrum of the waveguide reflector of FIG. 1.

The reflection spectrum, that is a plot of normalized reflectivity versus wavelength of light guided by the waveguide, for the reflector 10 is shown in FIG. 2. It should be noted that the reflection spectrum comprises six reflection maxima, which are narrow and high and are all of substantially the same reflectivity.

The width and height of the reflection maxima are determined by the number of repeat units within the grating structure. The more repeat units there are, the narrower and higher are the reflection maxima, that is the extinction ratios and special noise are better. The relative heights of the maxima, that is how flat the reflection spectrum is, are determined by the lengths of the gratings 22, 24, 26 within a repeat unit 20. The grating structure 18 is configured to provide adequate side-mode suppression of minor peaks by appropriate selection of the length of the grating 22, 24, 26. In general, the number of gratings within a repeat unit depends on the number of reflection maxima required in the desired reflection spectrum. For example, for the specific example described, the six reflection maxima are provided by the three gratings in each repeat unit.

Figure 3:
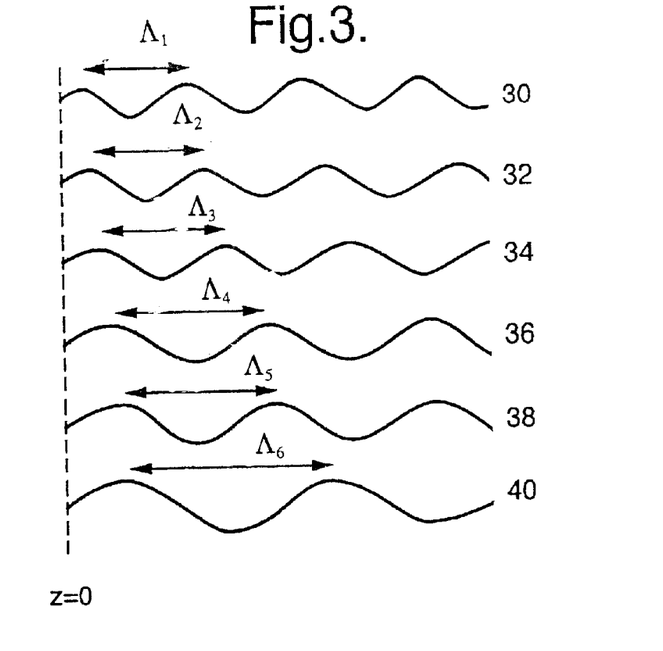
FIG. 3 is a schematic representation of a plurality of periodic intensity variations for describing the function of the waveguide of FIG. 1.

In order better to understand one way in which the lengths of the gratings (more precisely, the position of the phase shifts) within a repeat unit can be selected to produce a predetermined response it is instructive to consider the grating structure 18 as being analagous to the superposition of a number of periodic variations in magnitude, for example periodic variations in intensity. Referring to FIG. 3 there are shown six periodic variations 30, 32, 34, 36, 38, and 40 having respective different periods of $\Lambda_1, \Lambda_2, \Lambda_3, \Lambda_4, \Lambda_5$ and $\Lambda_6$ and corresponding frequencies $F_1, F_2, F_3, F_4, F_5$ and $F_6$ respectively. The periods $\Lambda_1$ to $\Lambda_6$ are selected such that the periodic variations have a constant spatial frequency spacing $\Delta F$, such that $$\Delta F = F_2 - F_1 = F_3 - F_2 = F_{n+1} - F_n = \text{a constant} \qquad \text{Eq. 1}$$

where $F_n = 1/\Lambda_n$.

At a nominal datum point, indicated as z=0 in FIG. 3, the periodic variations are all in phase.

Figure 4:
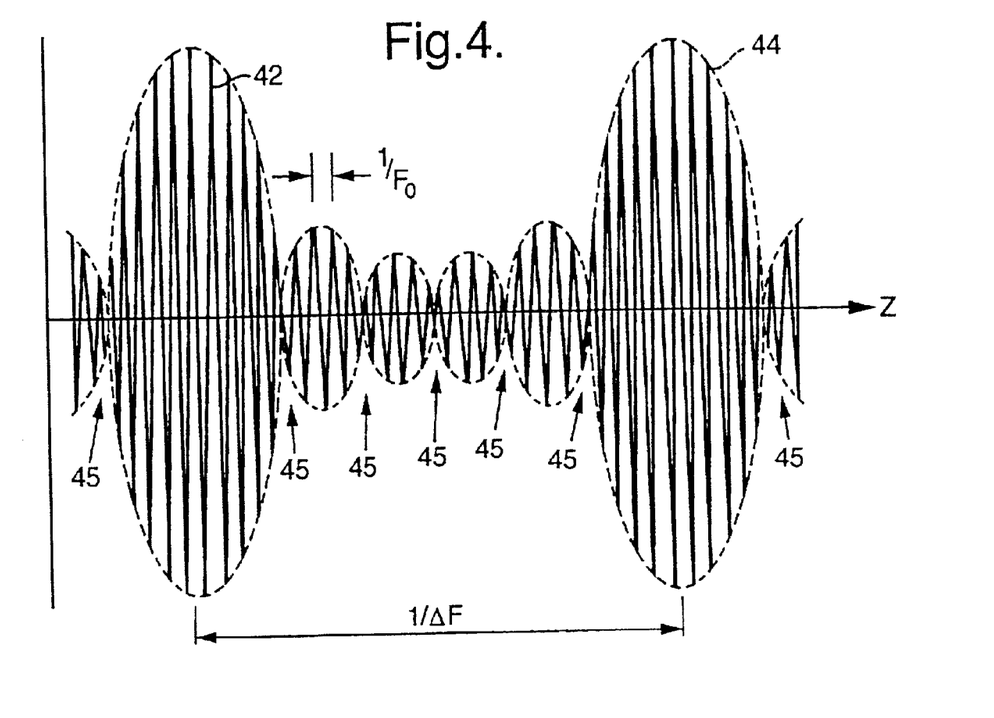
FIG. 4 represents the superposition of the periodic intensity variations of FIG. 3.

If the, six periodic intensity variations of FIG. 3 are superposed the result is the periodic waveform shown in FIG. 4. This waveform consists of a relatively rapidly varying underlying waveform 42 of spatial frequency $F_0$ (where $F_0 = 1/n\Sigma F_n$) which is magnitude modulated by a relatively slowly varying envelope 44 having a super period $1/\Delta F$. The envelope 44 is periodic and has a number of maxima separated by crossover points 45 at which the envelope 44 tends to zero. The envelope 44 can be applied in the making of a grating structure in the form of a plurality of adjacent gratings of identical constant pitch $1/F_0$ which are separated by phase shifts of $\pi$ radians. The positions of the phase shifts are selected to correspond with the positions of the crossover points 45 and the super period $1/\Delta F$ corresponds with the length of the repeat units 20.

Figure 5:
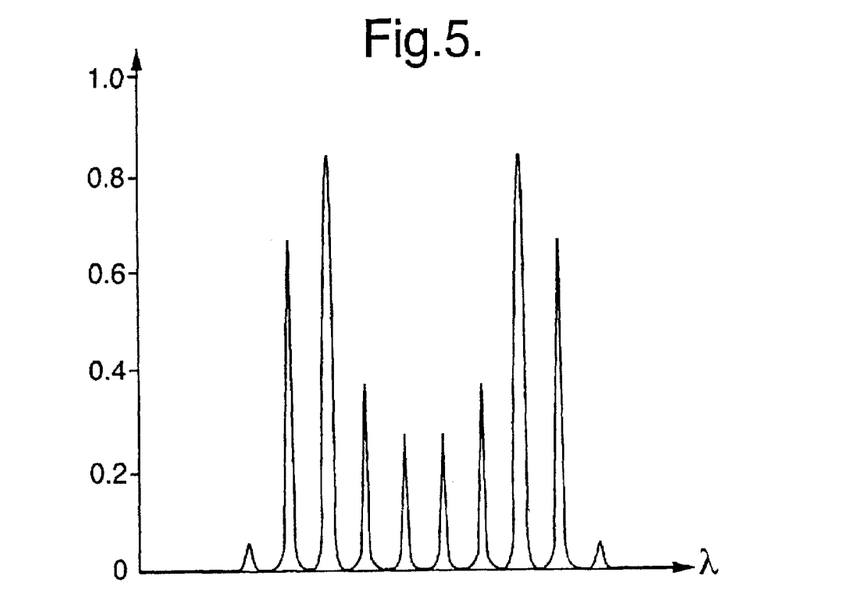
FIG. 5 is the reflection spectrum of the superposition of FIG. 4.

If the envelope waveform 44 is written into a medium as a constant amplitude square wave grating of constant pitch $1/F_0$ with phase changes of $\pi$ radians located at the crossover points 45 a multi-wavelength grating is formed whose reflection spectrum is shown in FIG. 5. It should be noted that there is considerable variation in the reflectivity values of the reflection maxima as compared to the spectrum of FIG. 2.

Figure 6:
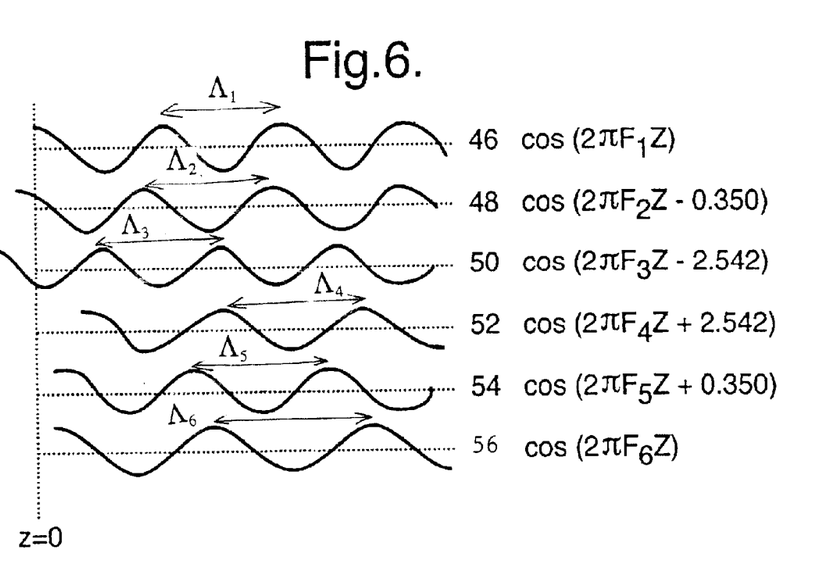
FIG. 6 is a schematic representation of a further plurality of periodic intensity variations.

The reflector 10 of FIG. 1 can be produced if only two of the periodic variations are in phase at the nominal datum point z=0 rather than them all being in phase. The other periodic variations have applied to them equal and opposite phase shifts. This is represented graphically in FIG. 6 for six periodic variations 46, 48, 50, 52, 54 and 56 of differing respective periods $\Lambda_1$ to $\Lambda_6$ and frequencies $F_1$ to $F_6$. In contrast to the periodic variations represented in FIG. 3 each periodic variation has applied to it a phase shift of $\phi_n$ such that the periodic variations 46 to 56 have respective phase shifts (in radians) of $\phi_n = 0$, $\phi_2 = -0.350$, $\phi_3 = -2.542$, $\phi_4 = +2.542$, $\phi_5 = +0.350$ and $\phi_6 = 0$.

Figure 7:
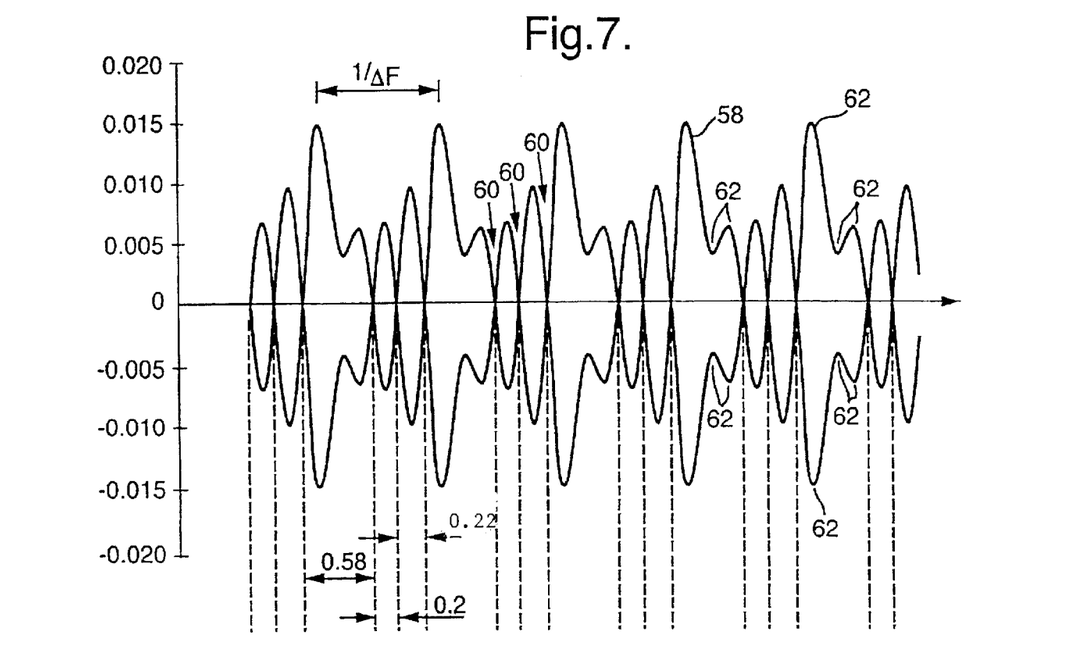
FIG. 7 represents the superposition of the periodic variations of FIG. 6.

If these phase shifted intensity variations are superposed they produce the multi-wavelength waveform depicted in FIG. 7 which, in common with that of FIG. 3, consists of a rapidly varying waveform which is modulated by a slowly varying envelope 58. For the sake of clarity only the envelope waveform 58 is shown in FIG. 7. It is to be noted that the phase of the rapidly varying waveform changes by $\pi$ radians at the crossover points 60 where the envelope waveform tends to zero. It should further be noted that there is no phase change at maxima and minima points 62.

From FIG. 7 it will be seen that for a super period $1/\Delta F$ of length unity the relative lengths between crossover points 60 within a super period are 0.58, 0.2 and 0.22 respectively. If the envelope waveform 58 is applied in the making of a grating structure in the form of a constant amplitude square wave grating of constant pitch $1/F_0$ having phase shifts of $\pi$ radians located at the points corresponding with the crossover points 60 the reflector of FIG. 1 results, which gives rise to the reflection spectrum of FIG. 2. In the embodiment of FIG. 1, which is a reflector with a Bragg wavelength around 1.55 µm using an InGaAsP optical medium of effective refractive index $n_{eff} = 3.23$, a grating pitch of 0.24 µm is required. $\Delta F$ is selected depending on the intended application of the reflector to be much less than $F_0$; typically $F_0$ is a thousand times $\Delta F$.

Figure 8:
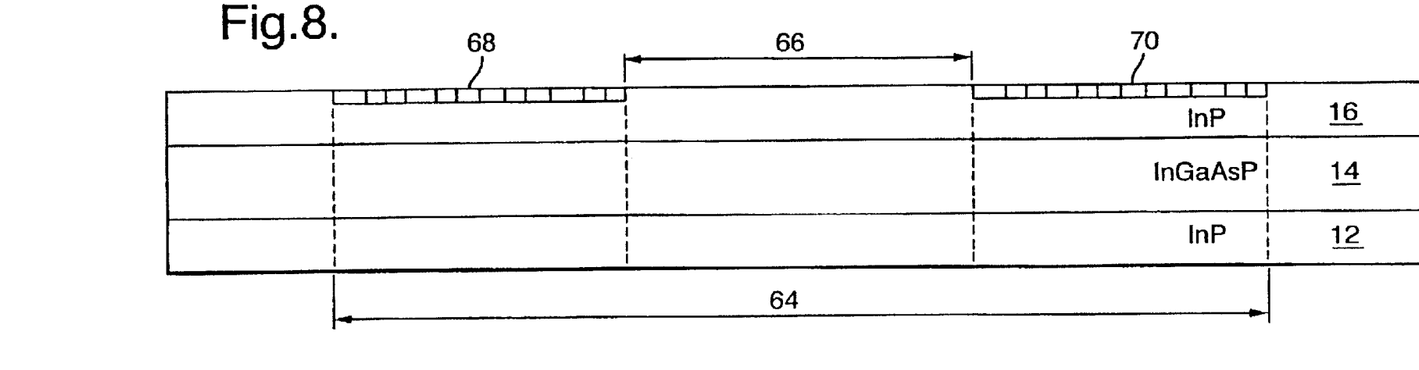
FIG. 8 is a schematic representation of a wavelength tuneable laser incorporating two reflectors in accordance with the invention.

A preferred method by which the grating structure of the present invention can be made is now described in relation to the fabrication of a tuneable wavelength laser of FIG. 8. Referring to FIG. 8 the tuneable laser comprises, within an optical layer 14, a laser cavity 64 which is defined by an active region 66 and two multi-wavelength diffraction gratings 68 and 70 located at a respective end of the region 66.

The multi-wavelength diffraction gratings 68, 70 are configured such that the reflection maxima in each grating have different spacings so that only one of the reflection maxima of each multi-wavelength diffraction grating 68, 70 can be in correspondence, and thus provide a low loss window, at any one time. In combination, the multi-wavelength diffraction gratings 68, 70 act as vernier. To operate the laser, a vernier circuit is provided which applies an electrical tuning current to the multi-wavelength diffraction gratings 68, 70 to shift the reflection maxima with respect to one another. In this way the laser can be tuned to emit light at a desired wavelength. A preferred method by which such layer can be made is now described.

Figure 9:
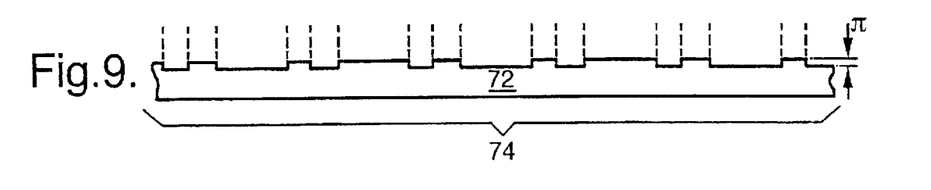
FIG. 9 is a phase plate derived from the superposition of FIG. 7.

With reference to FIG. 9, a quartz phase plate 72 is made using a well known photolithographic technique to define the phase steps in the grating structure 68, 70 of FIG. 8. FIG. 9 shows only the first region 74 of the phase plate 72 for producing the grating 68 and how it is derived from the envelope of FIG. 7. As will be seen from this Figure, the phase plate has a stepped structure in which the steps are located at positions which correspond with the crossover points 60 of the envelope 58. As will be apparent from FIG. 10, the phase plate 72 also includes a second stepped region 76 for defining the second grating 70. The phase plate 72 is then used in a two-beam holographic exposure process to record the two multi-wavelength gratings 68 and 70 in the upper layer 16.

Figure 10:
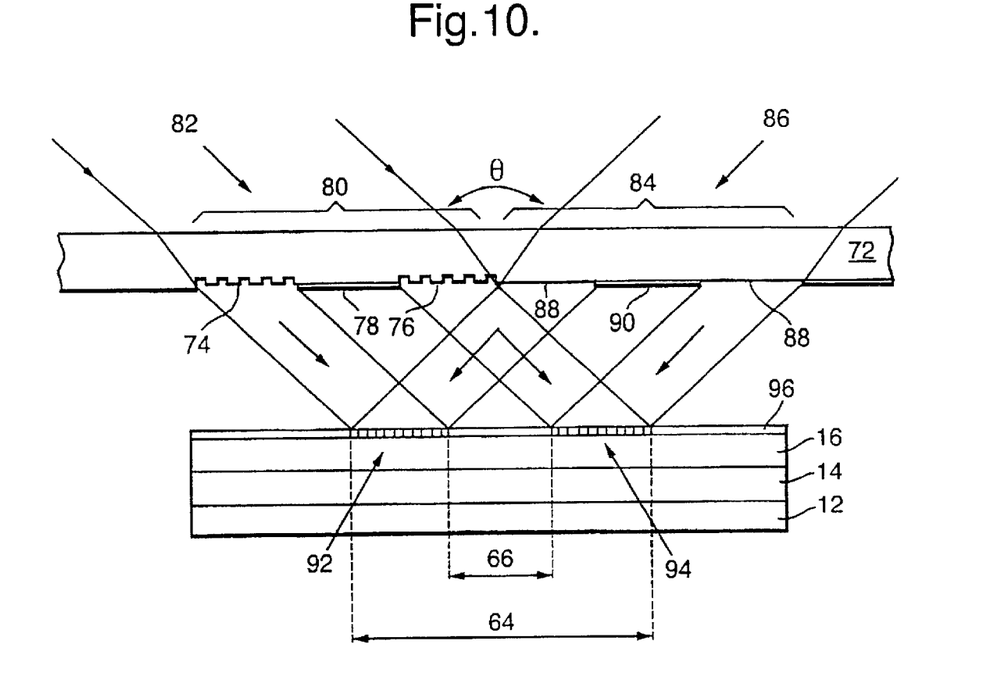
FIG. 10 illustrates a method in accordance with a further aspect of the invention for making the laser of FIG. 8.

As shown in FIG. 10 the stepped regions 74, 76 of the phase plate 72 are separated by a mask region 78. The stepped region 74, 76 and mask region 78 represent a first exposure unit 80 for a first beam of light 82. Adjacent to the first exposure unit 80 the phase plate 72 is provided with a second exposure unit 84 for a second beam of light 86. The second exposure unit 84 comprises two windows 88 which are separated by a further mask region 90.

The exposure units 80 and 84 are illuminated by respective UV coherent light beams 82 and 86, each having a wavelength of 351.1 nm, angularly separated by an angle θ. As can be seen in FIG. 10, the light beams 82 and 86 have regions of common incidence 92 and 94 on a photoresist layer 96 which is provided on the surface of the upper layer 16. The mask regions 78 and 90 serve so as to mask the active region 66 from the light beams 82 and 86. However, the photoresist is exposed on either side of the active region 66.

The envelope waveform, that is the series of $\pi$ phase shifts, is written into the photoresist layer 96 as a result relative phase differences between the beams 82 and 86 which are introduced by the stepped region 74, 76. The underlying grating structure is generated by interference of the two light beams 82 and 86. The pitch or period of the underlying grating structure depends on the angle θ between the beams 82, 86. A desired pitch may be readily obtained simply by altering θ. As an example for a required operation at 1.55 µm, θ is equal to 94°3'.

Once exposure is complete the photoresist layer 96 is developed and the upper layer 16 is then etched. As a result, multi-wavelength diffraction gratings are etched as physical surface relief diffraction gratings into the surface of the upper layer 16.

It should be noted that the envelope 58 of FIG. 7 has an intensity characteristic which, in the fabrication process discussed above, is difficult to provide as a corresponding intensity characteristic in the etched grating. This is because the photoresist has a binary nature; that is, it resists when not exposed and does not resist when exposed. Therefore it is difficult to provide variation in the etch rate of the photoresist and thus variation in etch depth of the physical grating. As a consequence, the grating is an approximation of the envelope waveform rather than a perfect replica. In practice, multi-wavelength gratings according to the invention are generated theoretically with approximately located phase shifts. The locations of the phase shifts are then optimised by modelling to correct for any degradation introduced by not including the intensity information.

Although the grating is only an approximation the resulting reflection spectrum is not degraded appreciably. In order to understand the theory behind this it is instructive to consider the case where individual periodic variations are written into a waveguide material by successive exposure steps. If the different exposure steps are of equal strength (that is, the product of the exposure time and average intensity are equal for each response), the total exposure distribution $I_{(z)}$ as function of position z along the waveguide can be described by:

$$I(z) = \frac{I_0}{2} \sum_n \left\{ 1 + \cos\left(\frac{2\pi z}{\Lambda_n} + \phi_n\right) \right\} \quad \text{Eq. 2}$$

where $I_0$ is the peak intensity, $\Lambda_n$ is the pitch and $\phi_n$ is the phase of the periodic variation n at a certain reference position z=0. The value of 1 is included in the expression to prevent the exposure distribution from taking a negative value. Since the sum is multiplied by $I_0/2$ the peak value of I(z) is equal to $I_0$ if n=1. The periodic variations have a uniform spatial frequency spacing ($\Delta F = F_{n+1} - F_n$ = a constant).

For an even number 2N of superposed periodic variations with frequencies centred on $F_0$ the total exposure distribution can be written as:

$$I(z) = NI_0 + \frac{I_0}{2} \sum_{n=1}^{N} \left\{ \cos\left(2\pi\left[F_0 + \left(n - \frac{1}{2}\right)\Delta F\right]z + \phi_n\right) + \cos\left(2\pi\left[F_0 - \left(n - \frac{1}{2}\right)\Delta F\right]z + \phi_{-n}\right)\right\}$$

$$= NI_0 + \frac{I_0}{2} \sum_{n=1}^{N} \left\{ \cos\left(2\pi\Delta F z\left(n - \frac{1}{2}\right) + \frac{1}{2}(\phi_n - \phi_{-n})\right) \cdot \cos\left(2\pi F_0 z + \frac{1}{2}(\phi_n + \phi_{-n})\right) \right\} \quad \text{Eq. 3}$$

If pairs of periodic variations have frequencies which are symmetrical about the central frequency $F_0$ and are provided with equal and opposite phase shifts at z=0, that is $\phi_n = -\phi_{-n}$, this simplifies to:

$$I(z) = NI_0 + I_0 \cos(2\pi F_0 z) \cdot E(z) \quad \text{Eq. 4}$$

where $$E(z) = \sum_{n=1}^{N} \cos\left(2\pi\Delta F z\left(n - \frac{1}{2}\right) + \phi_n\right) \quad \text{Eq. 5}$$

It should be noted that the rapidly varying underlying term $\cos(2\pi F_0 z)$ is independent of phase shift $\phi_n$. Only the slowly varying envelope function E(z) depends on $\phi_n$. Therefore the underlying waveform is uniform (except for the π phase shifts at the boundaries where the envelope tends to zero) and it is relatively straightforward to produce such a complete multi-wavelength grating with a phase plate in a single operation.

The function I(z) (Eq. 4) represents an intensity pattern of optical exposure in a photoresist. Exposure is a highly non-linear process and has a threshold intensity $I_{th}$. When the optical intensity exceeds $I_{th}$, the photoresist is developed to a depth from its surface and can readily be etched to this depth. If I(z) is less than $I_{th}$ there is insufficient development to enable the surface photoresist to be etched away. The ideal intensity pattern is a rectangular grating with equal tooth and gap widths. In order to achieve this ideal pattern with a superposition of periodic functions, a total exposure $I = NI_0 = I_{th}$ is required. This is described by a step function f(I):

$$f(I) = d/2\{1 + \text{sgn}(I\cos(2\pi F_0 Z)\cdot E(z))\} = d/2\{1 + \text{sgn}(\cos(2\pi F_0 z))\cdot\text{sgn}(E(z))\} \quad \text{Eq. 6}$$

where "sgn" is the sign and can take values of +1 or −1 such that f(I) can take values of 0 or d.

When E(z) changes sign the grating changes phase by ±π, giving rise to a pattern of envelope lobes differing in phase, with constant phase within each lobe.

The method of the invention thus provides a way of making a grating in a one-step process having a single exposure.

It will be appreciated, by those skilled in the art, that variations can be made to the reflector and/or method of the present invention which are within the scope of the invention. For example although surface relief gratings are described in the foregoing, it is envisaged to fabricate the grating in other forms such as a grating defined by a refractive index variation present in an optical fibre core which could be made by direct deep UV two-beam interference; a multi-layer dielectric stack such as could be used as part of a Fabry Perot filter or as a buried grating structure within a waveguide device. In the case of the latter these are conveniently formed by overgrowing the grating with a further semi-conducting layer. For example, in relation to the laser of FIG. 8, the upper layer 16 would comprise a quaternary layer of InGaAsP into which the surface relief grating is formed and which is then buried by overgrowing with a layer of InP. Furthermore it will be appreciated that, whilst the method of the present invention is particularly convenient for forming a grating structure having a series of phase shifts of pi radians, other fabrication methods can be used such as for example directly writing the grating structure using electron beam lithography.

What we claim is:

1. A multi-wavelength optical reflector comprising: a diffraction grating structure comprising a plurality of repeat grating units in which each grating unit comprises a series of adjacent diffraction gratings having the same pitch; wherein grating units and adjacent gratings within a grating unit are separated by a phase change of substantially pi (π) radians and wherein at least two of the gratings within a grating unit have different lengths; the lengths being selected so as to provide a predetermined reflection spectrum.

2. A reflector according to claim 1 in which adjacent grating units and/or adjacent gratings within a grating unit are substantially contiguous.

3. A reflector according to claim 1 in which the lengths of the gratings are selected by superposing a plurality of periodic variations having different periods to form a periodic waveform having a multi-lobed envelope and selecting the relative lengths of the gratings to correspond with the relative lengths at which the multi-lobed envelope tends to zero.

4. A reflector according to claim 3 and further comprising imparting phase shifts to individuals of the plurality of periodic variations.

5. A reflector according to claim 4 in which pairs of the phase shifts are imparted to individuals of the plurality of variations, the pairs of phase shifts having equal magnitude but opposite sign.

6. A reflector according to claim 4 in which the periodic variations are not all in phase at any point along the length over which they are superposed.

7. A reflector according to claim 1 in which the reflector comprises a waveguide.

8. A multi-wavelength filter incorporating a reflector according to claim 1.

9. A laser incorporating an optical reflector in accordance with claim 1.

10. A method of producing a reflector in accordance with claim 1 wherein a single exposure step is used to produce a pattern from which the diffraction grating structure is obtained.

* * * * *